(12) United States Patent
Ishida et al.

(10) Patent No.: US 8,608,378 B2
(45) Date of Patent: Dec. 17, 2013

(54) TEMPERATURE MEASURING APPARATUS

(75) Inventors: Hisaki Ishida, Nirasaki (JP); Masato Hayashi, Nirasaki (JP); Koudai Higashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/516,916

(22) PCT Filed: Dec. 6, 2010

(86) PCT No.: PCT/JP2010/071841
§ 371 (c)(1),
(2), (4) Date: Jun. 18, 2012

(87) PCT Pub. No.: WO2011/074434
PCT Pub. Date: Jun. 23, 2011

(65) Prior Publication Data
US 2012/0269229 A1 Oct. 25, 2012

(30) Foreign Application Priority Data
Dec. 18, 2009 (JP) ................................. 2009-288410

(51) Int. Cl.
*G01K 7/00* (2006.01)
(52) U.S. Cl.
USPC .......................................... 374/183; 374/161
(58) Field of Classification Search
USPC .......... 374/161, 183, 131, 137, 166, E11.017; 324/158.1, 763; 438/5
See application file for complete search history.

(56) References Cited

U.S. PATENT DOCUMENTS 6,140,833 A * 10/2000 Flietner et al. ............. 324/750.3
6,472,240 B2 * 10/2002 Akram et al. .................. 438/18
(Continued)

FOREIGN PATENT DOCUMENTS

| JP | 2001-099719 A | 4/2001 |
| JP | 2007-536726 A | 12/2007 |
| JP | 2008-139067 A | 6/2008 |
| WO | 2007/119359 A1 | 10/2007 |

OTHER PUBLICATIONS

Farrokh Ayazi, Khalil Najafi, "High Aspect-Ratio Combined Poly and Single-Crystal Silicon (HARPSS) MEMS Technolog", Journal of Microelectromechanical Systems, vol. 9, No. 3, Sep. 2000, pp. 288-294.*

(Continued)

*Primary Examiner* — Harshad R Patel
*Assistant Examiner* — Nasir U Ahmed
(74) *Attorney, Agent, or Firm* — Nath, Goldberg & Meyer; Jerald L. Meyer; Scott Langford

(57) ABSTRACT

Disclosed is a temperature measuring apparatus which is provided with: a substrate (2); a temperature sensor (3) disposed on one surface of the substrate (2); and a wire (8) disposed to electrically connect together a circuit, which detects a temperature using the temperature sensor (3), and the temperature sensor (3). In said surface of the substrate (2), a recessed section (7) having a heat capacity smaller than that of the material of the substrate (2) is formed on the periphery of the temperature sensor (3). The recessed section (7) is formed at a predetermined interval from the temperature sensor (3) such that the recessed section surrounds the temperature sensor (3) and has predetermined width and depth. Preferably, the low heat capacity zone is the recessed section (7), i.e., the groove having a recessed cross-section.

8 Claims, 10 Drawing Sheets

(56) References Cited

U.S. PATENT DOCUMENTS

| | | | |
|---|---|---|---|
| 6,895,831 B2* | 5/2005 | Hunter | 73/865.9 |
| 6,995,691 B2* | 2/2006 | Parsons | 340/999 |
| 7,005,644 B2* | 2/2006 | Ishikawa et al. | 250/339.04 |
| 7,135,852 B2* | 11/2006 | Renken et al. | 438/5 |
| 7,364,932 B2* | 4/2008 | Ikushima et al. | 438/53 |
| 2004/0169579 A1* | 9/2004 | Mattes et al. | 338/25 |
| 2006/0174720 A1* | 8/2006 | Renken et al. | 73/866.1 |
| 2006/0185429 A1* | 8/2006 | Liu et al. | 73/146.5 |

OTHER PUBLICATIONS

International Search Report for PCT/JP2010/071841, Japanese Patent Office, mailed Mar. 1, 2011.

* cited by examiner

TEMPERATURE MEASURING APPARATUS

TECHNICAL FIELD

The present disclosure relates to a temperature measuring apparatus that measures the actual temperature of a substrate that is being heated in a heat treatment unit in a semiconductor manufacturing process or the like.

BACKGROUND

Products such as semiconductors or liquid crystal displays are manufactured by performing a series of steps that include cleaning a semiconductor substrate, applying a photoresist, exposure, development, etching, forming an inter-layer dielectric, heat treatment, and dicing. Among such steps, for example, heat treatment may be performed after a pattern is exposed; a Spin On Glass (SOG) material, which is the material of the inter-layer dielectric, is applied; or a photoresist is applied. Heat treatment is an important step necessary for the manufacturing process of a semiconductor or a liquid crystal display.

Heat treatment of a substrate is performed in a heat treatment unit. In this case, it is important to manage the temperature in the heat treatment unit due to a defect of the film thickness of a photoresist or a development failure occurring when the temperature is not appropriately managed. Further, during development, etching, sputtering, Chemical Vapor Deposition (CVD), or the like, controlling the surface temperature of the substrate is required. Therefore, technology has been used to measure the actual temperature of the substrate processed in the heat treatment unit, not the temperature of the heat treatment unit, by using a dummy substrate with a temperature sensor buried therein.

However, in the measurement technology, the temperature sensor that is formed of a material having heat physical properties that differ from those of a substrate, such as heat conductivity or specific heat, is buried in the dummy substrate. For this reason, an error sometimes occurs between the actual temperature of the substrate and the temperature measured by the dummy substrate. Accordingly, a temperature measurement substrate is being developed to more accurately measure the actual temperature of the substrate.

For example, a first patent document discloses a temperature measurement substrate that includes: a substrate where a plurality of concave portions is formed at a surface of the substrate; and a plurality of temperature detection elements which are adhered to the plurality of concave portions and have a crystal vibrator. Further, a second patent document discloses a device for measuring parameters (including temperature) of a substrate. In the substrate temperature measuring apparatus disclosed in the second patent document, a filling material (bonding material or potting material) having specific heat characteristics is used when disposing an electronic processing component and the like (integrated circuit, etc.) in a cavity of the substrate. Therefore, the device can detect a change in the temperature of the substrate substantially identically to a substrate having no electronic processing component.

PRIOR ART DOCUMENTS

Patent Documents

First patent document: Japanese Laid-Open Patent Publication No. 2008-139067
Second patent document: Japanese Laid-Open Patent Publication No. 2007-536726

Presently, in a temperature measuring apparatus, a Resistance Temperature Detector (RTD), a thermocouple, a Complementary Metal Oxide Semiconductor (CMOS) temperature sensor, or a thermistor is being used as a temperature sensor. In the temperature measurement substrate disclosed in the first patent document, the temperature of a substrate is measured by using a crystal vibrator as a temperature detection element. However, transient thermal characteristics around the detection element are delayed relative to those of the actual substrate due to the adhesive that adheres the package (temperature detection element) with the built-in crystal vibrator to a concave portion, and the heat physical properties, such as heat capacity or specific heat, of the material of the package.

The substrate temperature measuring apparatus disclosed in the second patent document uses a potting material or a bonding material having specific heat characteristics, and thus can sense a change in the temperature of a substrate substantially identically to a substrate with no electronic processing component. That is, the device enables the substrate to have transient thermal characteristics close to those of an actual substrate. In this case, it is preferable to use a material having very high heat conductivity as a bonding material. In the second patent document, for example, an epoxy material with diamond particles filled therein is used as a bonding material.

However, when the above-described material is used as a bonding material, the manufacturing cost of a temperature measuring apparatus increases. In addition, transient thermal characteristics around the detection element in the temperature measurement substrate are delayed relative to those of the actual substrate due to the heat capacity of the material forming the electronic processing component.

SUMMARY

The object of the present disclosure is to provide a temperature measuring apparatus that can measure the actual temperature of a substrate, processed in a heat treatment unit, at high precision since transient thermal characteristics around a temperature sensor are close to those of an actual substrate.

According to one embodiment of the present disclosure, a temperature measuring apparatus includes: a substrate; at least one temperature sensor disposed at one surface of the substrate; and a low heat capacity band surrounding the temperature sensor and spaced apart from the temperature sensor on the substrate, wherein the low heat capacity band is formed of a material having a heat capacity lower than a material forming the substrate.

In one embodiment, a distance between the temperature sensor and the low heat capacity band, and a width, and a depth of the low heat capacity band are determined such that the sum of the heat capacity of the temperature sensor and the heat capacity of a peripheral member of the temperature sensor becomes equal to the heat capacity of the actual substrate.

In one embodiment, the low heat capacity band is a groove having a concave-shaped sectional surface.

In one embodiment, the low heat capacity band is formed of a material having a porous structure.

In one embodiment, the low heat capacity band is formed of nano crystal silicon.

In one embodiment, a hole portion, in which the temperature sensor is buried, is formed at one surface of the substrate, the temperature measuring apparatus is comprised of a binder configured to fix the temperature sensor in the hole portion and a sealing material configured to seal the hole portion with the temperature sensor fixed therein, and the low heat capacity band is formed to surround the temperature sensor and the hole portion, and is spaced apart from the hole portion.

In one embodiment, the temperature measuring apparatus has a wafer shape.

In one embodiment, the temperature sensor is an RTD.

In one embodiment, the temperature measuring apparatus comprises, on the substrate, a detection unit configured to detect a temperature using the temperature sensor; a storage unit configured to store data of a temperature detected by the circuit; and a feeding unit configured to supply power to the circuit.

According to the present disclosure, it is possible to provide a temperature measuring apparatus which can measure the actual temperature of a substrate, processed in a heat treatment unit, at high precision since transient thermal characteristics around a temperature sensor are close to those of an actual substrate.

DETAILED DESCRIPTION

Figure 1:
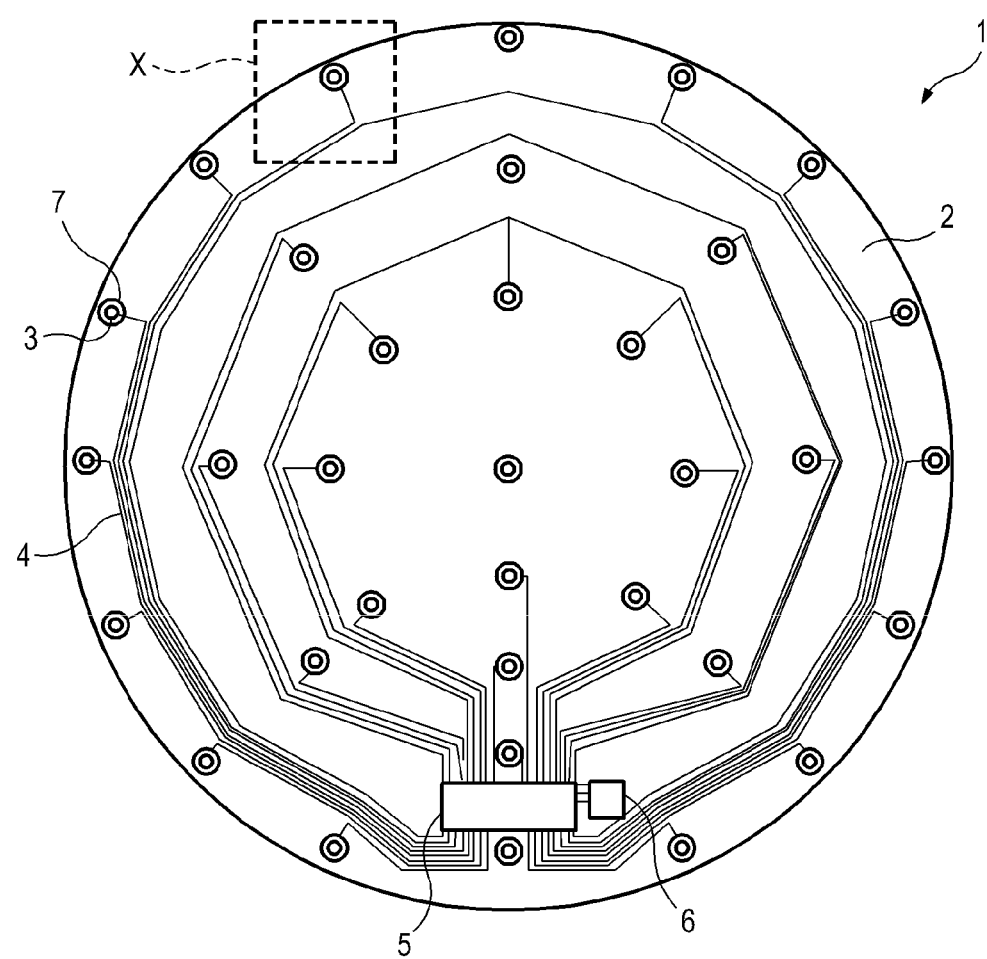
FIG. 1 is a schematic view illustrating a configuration example of a temperature measurement wafer according to an embodiment.

Hereinafter, embodiments of the present disclosure will be described in detail with reference to the drawings. In the drawings, same reference numerals refer to the same or corresponding elements.

Embodiment

A temperature measurement wafer according to an embodiment will now be described with reference to FIG. 1. The temperature measurement wafer 1 includes a substrate 2, a plurality of temperature sensors 3, a wiring 4, a processing part 5, a power source part 6, and a concave portion 7. There are a member and the like configuring the temperature measurement wafer 1 around each of the temperature sensors 3, of which detailed description will be made later. The temperature measurement wafer 1 is used for measuring the actual temperature of a wafer that is processed in a heat treatment unit in a semiconductor manufacturing process. The material of the temperature measurement wafer 1 is the same as that of an actually processed wafer.

The substrate 2 is formed of silicon. Also, a $SiO_2$ layer or a polyimide layer may be formed as a protective layer on an upper surface of the substrate 2. Further, materials that are known in the art may also be used.

Figure 2:
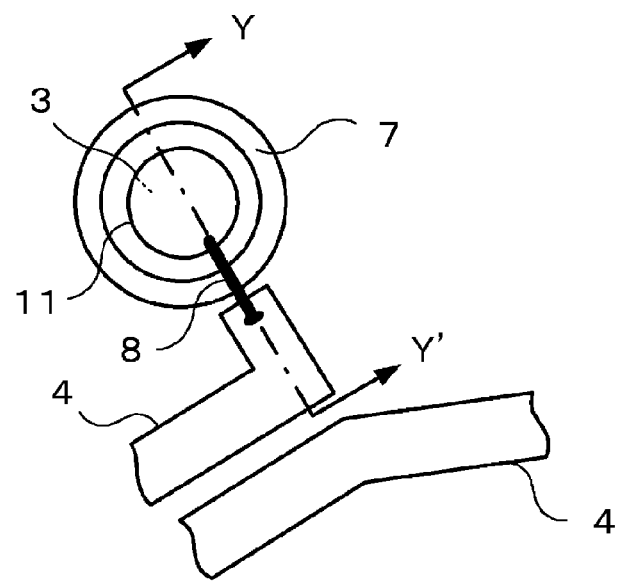
FIG. 2 is an enlarged view of portion X of FIG. 1.

The wiring 4 is formed of a conductive material. For example, the wiring 4 may be formed of aluminum, copper, gold, titanium, tungsten, molybdenum, or an alloy thereof. As illustrated in FIG. 1, the wiring 4 extends on one surface of the substrate 2 so as to electrically connect the processing part 5 and each temperature sensor 3. As illustrated in FIG. 2, corresponding to the portion illustrated by a dashed line X in FIG. 1, the temperature sensor 3 and the wiring 4 are not directly connected to each other electrically, but are connected through a wire 8. Further, although not shown in detail in FIG. 1, the wiring 4 and the processing part 5 are also connected to each other through the wire 8.

The processing part 5 includes a circuit that detects a temperature with each temperature sensor 3, and a circuit that stores the data of the detected temperature. A Micro Processing Unit (MPU), an Analog to Digital (A/D) converter, a memory, an analogy switch (SW) and the like are mounted on the circuits. For example, the processing part 5 is formed by mounting the above-described circuit on a substrate according to a wire bonding technology, and adhered to the substrate 2 by heat compression. The processing part 5 adhered to the substrate 2 is electrically connected to the wiring 4 through the wire 8. However, the processing part 5 may not only be disposed on the substrate 2 but may be disposed outside the substrate 2.

The power source part 6 is electrically connected to conductors such as the processing part 5 and the wire 8, and supplies a source voltage to the temperature measurement wafer 1. A battery or a Direct Current (DC) power source, for example, a thin film solid electrolyte battery, is mounted on the power source part 6. The power source part 6 is charged by a cable. The power source part 6 may be disposed on the substrate 2 or outside the substrate 2.

Figure 3:
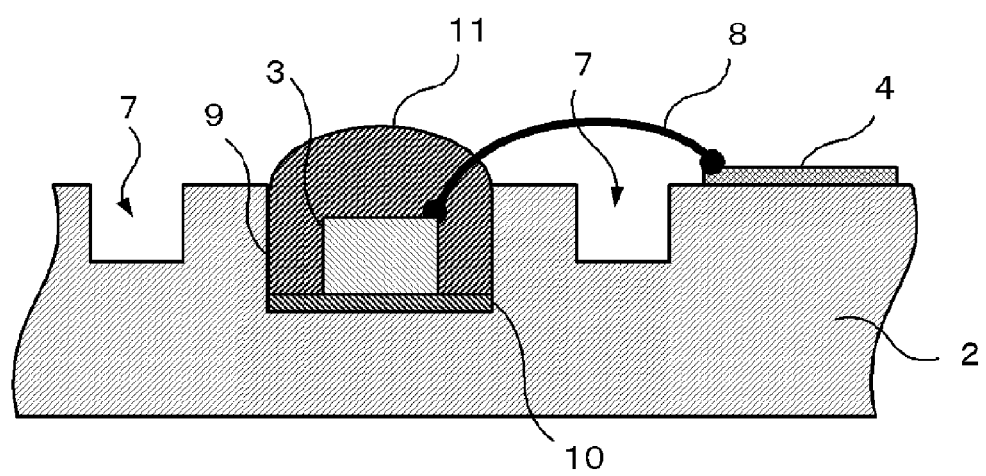
FIG. 3 is a sectional view taken along line Y-Y' of FIG. 2.

The plurality of temperature sensors 3 is disposed at one surface of the substrate 2. As illustrated in FIG. 2 and FIG. 3, which is a sectional view taken along line Y-Y' of FIG. 2, the temperature sensor 3 is buried inside a hole portion 9 having an approximately circular shape and formed at one surface of the substrate 2. Also, a binder 10 for fixing the temperature sensor 3 is sealed in a bottom portion of the hole portion 9.

The temperature sensor 3 and the wire 4 are electrically connected to each other through the wire 8 according to a wire bonding technology. The hole portion 9 with the temperature sensor 3 buried therein is potted by a sealing material 11. The concave portion 7, which is a groove that is approximately circular in shape when seen from a top thereof and has a concave-shaped sectional surface, is formed at an outer circumference of the hole portion 9 with the temperature sensor 3 buried therein. The concave portion 7 is formed to completely surround the temperature sensor 3 and the hole portion 9 with a certain distance between the hole portion 9 and the concave portion 7. Also, the concave portion 7 has a certain depth from one surface of the substrate 2. The distance between the concave portion 7 and the temperature sensor 3, the depth from a corresponding surface, and the horizontal width of the concave portion 7 will be described in detail below.

The material of the binder 10 preferably has high heat conductivity, as in the silicon that forms the substrate 2. Also, it is necessary to use a material that has heat resistant properties and hardly generates gas, even when a temperature rises by heating, as the material of the binder 10. For example, silicon-based rubber with a heat conductive filler mixed therein may be used as the material of the binder 10. In consideration of a heat expansion rate difference between the sealing material 11 and the silicon that forms the substrate 2, it is also necessary to use an elastic material as the material of the sealing material 11. For example, silicon-based rubber in which a heat conductive filler similar to the binder 10 is mixed may be used as the sealing material 11. Further, a material known in the art may also be used as the sealing material 11. The temperature sensor 3 that is used in the present embodiment is an RTD. Preferably, the temperature sensor 3 is a platinum (Pt) RTD.

Hereinafter, a method of manufacturing the temperature measurement wafer 1 according to the present embodiment will be briefly described with reference to FIGS. 4A to 4D. The present disclosure relates to an area around the temperature sensor 3 of the temperature measurement wafer 1. Methods of manufacturing the other areas of the wafer are performed according to technology known in the art.

Figure 4A:
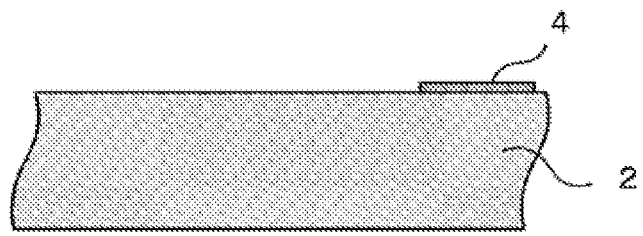
FIG. 4A is a sectional view illustrating a manufacturing process which forms a wiring on a substrate in a temperature measurement wafer according to an embodiment of the present disclosure.
Figure 4B:
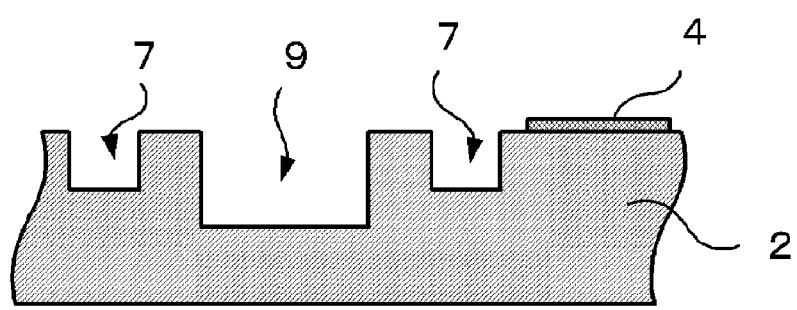
FIG. 4B is a sectional view illustrating a manufacturing process which forms a hole portion and a concave portion in the substrate.

As illustrated in FIG. 4A, the substrate 2 of the temperature measurement wafer 1 is selected, and the wiring 4 formed of a conductor is patterned on one surface of the substrate 2. Next, as illustrated in FIG. 4B, the hole portion 9 for burying the temperature sensor 3 therein and the concave portion 7 are formed by sandblasting or etching.

Figure 4C:
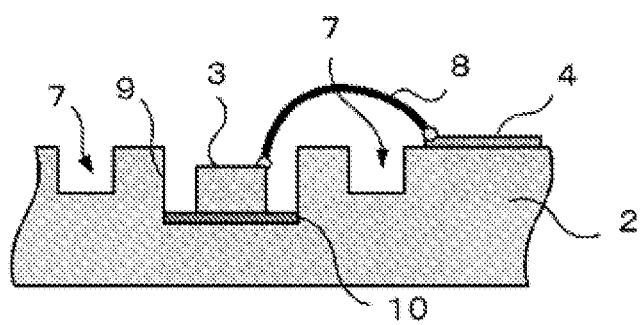
FIG. 4C is a sectional view illustrating a manufacturing process which buries a temperature sensor in the hole portion and connects the temperature sensor to the wiring with a wire.
Figure 4D:
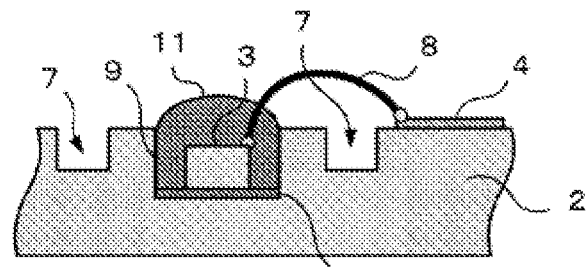
FIG. 4D is a sectional view illustrating a manufacturing process which seals the temperature sensor buried in the hole portion.

Next, as illustrate in FIG. 4C, the temperature sensor 3 is buried in the hole portion 9, and the temperature sensor 3 and the wiring 4 are connected to each other via the wire 8. That is, the binder 10 is injected into the formed hole portion 9, the temperature sensor 3 is fixed in the hole portion 9, and the temperature sensor 3 and the wiring 4 are electrically connected to each other via the wire 8 according to a wire bonding technology. As illustrated in FIG. 4D, the temperature sensor 3 buried in the hole portion 9 is sealed. That is, the hole portion 9 with the temperature sensor 3 buried therein is potted with the sealing material 11.

The following description will briefly be made on a method of using the temperature measurement wafer 1 according to the present embodiment, namely, an example of a method for measuring the actual temperature of a wafer, which is processed in a heat treatment unit, by using the temperature measurement wafer 1.

First, a wafer transfer arm loads the temperature measurement wafer 1 into the heat treatment unit. At this point, for example, measurement conditions such as the number of temperature measurements and a measurement distance are set through a cable using a Personal Computer (PC), and the processing part 5 stores the measurement conditions. When the temperature measurement wafer 1 is heated in the heat treatment unit, a resistance value of each temperature sensor 3 (RTD) of the temperature measurement wafer 1 is changed. The processing part 5 detects the change in a temperature from the change in the resistance value of each temperature sensor 3 (RTD), and data of the detected temperature is stored. The previously charged power source part 6 supplies a voltage to an electric circuit of the temperature measurement wafer 1.

When measurement of the temperature is ended, temperature measurement data of the wafer measured by the temperature measurement wafer 1 is read out as digital data of a temperature from the processing part 5 to the personal computer (PC) by the cable. The power source part 6 is charged by the cable. Moreover, details of the use of the dummy wafer for temperature measurement are referenced in Japanese Patent No. 3583665.

The read temperature data becomes very close to the temperature value of a wafer which is used in the heat treatment unit in an actual process. This is because the concave portion 7 is formed around each temperature sensor 3 in the temperature measurement wafer 1 according to the present embodiment. That is, in heat treatment, air fills the concave portion 7. The air has a heat capacity lower than that of silicon, which is the material of the substrate 2, and thus, the concave portion 7 functions as a low heat capacity band. Therefore, the entire heat capacity of the temperature measurement wafer 1 is reduced compared to a wafer that does not have the concave portion 7. In a wafer having the concave portion 7, the entire transient thermal characteristics of the wafer are enhanced when the wafer is heated identically to that of a wafer having no concave portion. Accordingly, transient thermal characteristics are enhanced in the periphery of each temperature sensor 3, and thus, the transient thermal characteristics of the temperature sensor 3 region can be close to those of a wafer that does not have the temperature sensors 3.

Moreover, the horizontal width, depth, forming position [a distance from the temperature sensor 3] and the like of the concave portion 7 are previously adjusted and set such that transient thermal characteristics around the temperature sensor 3 becomes closer to those of an actual wafer (substrate). That is, the distance, width, and depth from the temperature sensor 3 of the concave portion 7 are adjusted and set appropriately according to the kind (material) and size of the temperature sensor 3, the material of the binder 10, or the thickness of the substrate 2. In order to estimate the optimal shape of the concave portion 7, the temperature measurement wafer 1 is divided into a plurality of components, and the heat capacity of each of the components is calculated and determined. For example, the heat capacity of the temperature sensor 3 is defined as $Cs J/K \cdot m^3$, the heat capacity of a bonding material is defined as $Cb J/K \cdot m^3$, the heat capacity of the material of the concave portion 7 is defined as $Cz J/K \cdot m^3$, the heat capacity of Si is defined as $Csi J/K \cdot m^3$, and the heat capacity of the other electronic processing components is defined as $Cc J/K \cdot m^3$. The position of the concave portion 7 from the temperature sensor 3 and the horizontal width and depth of the concave portion 7 are adjusted such that the heat capacity $Cv J/K \cdot m^3$ of an actual wafer (substrate) is equal to the heat capacity $Cs J/K \cdot m^3$ of the temperature sensor 3 and the sum of the heat capacities of the other members, for example, the bonding material, the material of the concave portion 7, Si, and the other electronic components ($Cb J/K \cdot m^3 + Cz J/K \cdot m^3 + Csi J/K \cdot m^3 + Cc J/K \cdot m^3$).

According to the temperature measurement wafer 1 of the present embodiment, transient thermal characteristics around the temperature sensor 3 are close to those of an actual wafer, and thus, the actual temperature of a wafer that is processed in the heat treatment unit can be measured at high precision. Particularly, since the transient thermal characteristics around the temperature sensor 3 are close to those of an actual wafer, a temperature measurement that is performed using the dummy wafer for the temperature measurement of the present embodiment can more accurately measure a temperature immediately after the start of heating (change of a temperature) compared to a conventional temperature measurement wafer.

First Modification Example of Embodiment

Figure 5:
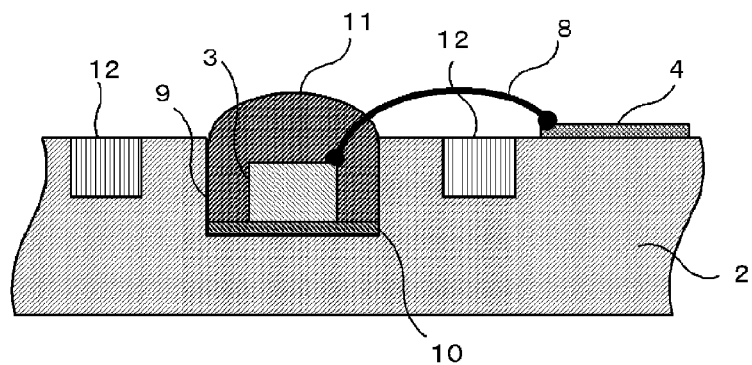
FIG. 5 is a sectional view illustrating the periphery of a temperature sensor of a temperature measurement wafer according to a first modification example of the embodiment.

A first modification example of the present embodiment will now be described with reference to FIG. 5. A summary of the configuration of the temperature measurement wafer 1 illustrated in FIG. 5 is similar to the embodiment of FIG. 1. The details of the substrate 2, the temperature sensor 3, the wiring 4, the processing part 5, the power source part 6, the wire 8, the hole portion 9, the binder 10, and the sealing material that are respective elements of the temperature measurement wafer 1 are similar to those in the previously described embodiment of FIG. 1.

In the first modification example, instead of the concave portion 7, a plurality of porous bands 12 having an approximately circular shape are formed at a certain distance from the hole portion 9 having an approximately circular shape, similar to the concave portion 7. The porous band 12 is formed to completely surround the periphery of the temperature sensor 3 and hole portion 9 and have a certain depth from one surface of the substrate 2. The shape of the porous band 12, as seen from an upper side near the temperature sensor 3 illustrated in FIG. 5, is similar to that of the concave portion 7 illustrated in FIGS. 2 and 3. The porous band 12 may be formed of porous silicon, and preferably, a material such as nano crystal silicon.

A method of manufacturing the temperature measurement wafer 1 according to the first modification example is substantially similar to the manufacturing method according to the embodiment of FIGS. 4A to 4D, but differ in that the concave portion 7 is not formed in the manufacturing stage of FIG. 4B. As described above, the porous band 12 is formed of porous silicon (including nano crystal silicon). For example, the porous band 12 is formed by performing anodic oxidation processing to the portion, which becomes the porous band 12 on the substrate 2 (silicon), in an electrolyte including a mixed solution of hydrogen fluoride solution and ethanol. A more detailed method for forming the porous silicon from silicon is referenced in Japanese Laid-Open Patent Publication No. 2005-073197.

Moreover, the horizontal width, depth, forming position (distance from the temperature sensor 3) and the like of the porous band 12 are previously adjusted and set such that transient thermal characteristics around the temperature sensor 3 becomes closer to those of an actual wafer (substrate). That is, the distance, width, and depth from the temperature sensor 3 of the porous band 12 are adjusted and set appropriately according to the kind (material) and size of the temperature sensor 3, the material of the binder 10, or the thickness of the substrate 2.

Even in the temperature measurement wafer 1 of the first modification example of the present embodiment, the porous band 12, which is formed of a material [porous silicon (including nano crystal silicon)] having a heat capacity lower than that of the material (silicon) of the substrate 2, is formed around the temperature sensor 3, and functions as a low heat capacity band. Accordingly, transient thermal characteristics around the temperature sensor 3 are close to those of an actual wafer, and thus, the actual temperature of a wafer that is processed in the heat treatment unit can be measured at high precision.

Second Modification Example of Embodiment

Figure 6:
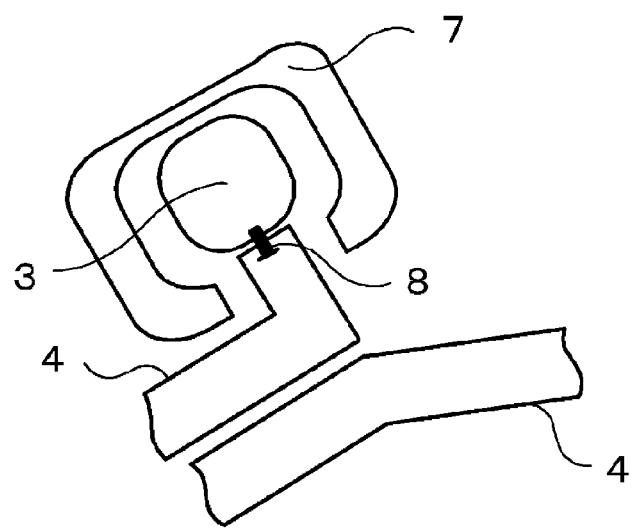
FIG. 6 is an enlarged view illustrating the periphery of a temperature sensor of a temperature measurement wafer according to a second modification example of the embodiment.

A second modification example of the present embodiment will now be described with reference to FIG. 6. A summary of the configuration of the temperature measurement wafer 1 illustrated in FIG. 6 is similar to that of the embodiment of FIG. 1. Further, the details of the respective elements of the temperature measurement wafer 1 are similar to those of the previously described embodiment of FIG. 1.

The second modification example of the present embodiment differs from the above-described embodiments in that the concave portion 7 does not completely surround the temperature sensor 3 and the hole portion 9. That is, as illustrated in FIG. 6, the concave portion 7 that has an approximately tetragonal shape when seen from the top thereof is not formed in the portion where the wiring 4 and the temperature sensor 3 are connected to each other through the wire 8.

However, even in the temperature measurement wafer 1 with such concave portion 7 formed therein, a low heat capacity band [concave portion 7] is formed to surround the temperature sensor 3 to a certain degree, and thus, transient thermal characteristics around the temperature sensor 3 can be close to those of an actual wafer. Accordingly, the actual temperature of a wafer that is processed in the heat treatment unit can be measured at high precision. Also, the concave portion 7 is not formed at a portion where the wiring 4 and the temperature sensor 3 are connected to each other, and thus, it is possible to design the wiring 4 to be extended similarly to the conventional technology.

As described above, in the temperature measuring apparatus according to the present embodiments, a low heat capacity band [porous band 12, concave portion 7, or the like] may be formed to surround the temperature sensor 3 to a certain degree with a certain distance from the temperature sensor 3, and the low heat capacity band may not be continuously formed throughout the entire perimeter.

For example, in addition to the second modification example of the present embodiment, a fragmentary low heat capacity band instead of the continuous low heat capacity band may be formed to surround the temperature sensor 3 to a certain degree. However, the width, depth, and forming position [distance from the temperature sensor 3] of the low heat capacity band are required to be previously adjusted such that transient thermal characteristics around the temperature sensor 3 becomes close to those of an actual wafer (substrate) by increasing the transient thermal characteristics around the temperature sensor 3.

In the above-described embodiments (including the first modification example and the second modification example), the temperature sensor 3 and the processing part 5 have been described as being connected to each other by the wiring 4 and the wire 8. However, if a conductor connects the temperature sensor 3 and the processing part 5 such that the temperature sensor 3 and the processing part 5 are electrically connected to each other, the temperature measuring apparatus according to the present disclosure is not restricted in its configuration.

Alternatively, the processing part 5 and the power source part 6 described above are simply examples, and the temperature measuring apparatus according to the present disclosure may use conventional technology and electronic components for detecting a temperature with the temperature sensor 3. For example, the processing part 5 may directly read out temperature data by a cable, without storage means. It is also possible to directly supply a voltage to the temperature measuring apparatus, without the power source part 6. Alternatively, the electronic components may not be disposed on the substrate 2.

In the above-described embodiments (including the first modification example and the second modification example), the temperature sensor 3 has been described as being an RTD. However, in addition to an RTD, a known temperature sensor 3 such as a thermocouple or a thermistor may be used as the above-described temperature sensor 3. The temperature sensors 3 may preferably be provided in a plurality, but the number of temperature sensors 3 is not limited to the number of the temperature sensors illustrated in FIG. 1. Also, the temperature sensor 3 is not required to be configured where the temperature sensor 3 is completely buried inside the hole portion 9 formed in the substrate 2, as described in the above-described embodiments (including the first modification example and the second modification example).

The configuration around the temperature sensor 3 illustrated in FIG. 3 and the like is merely an example. For example, an upper portion of the temperature sensor 3 may protrude from the substrate 2. The temperature sensor 3 may be configured to be buried close to an inner wall of the hole portion 9. Alternatively, the hole portion 9 may not be formed, and the temperature sensor 3 may be directly adhered onto the substrate 2. In this case, a low heat capacity band is formed to surround the temperature sensor 3 only a certain distance from the temperature sensor 3.

In the embodiments (including the first modification example and the second modification example), the temperature measuring apparatus according to the present disclosure has been described as having a wafer shape. However, the present disclosure may also be applied to a temperature measuring apparatus for a liquid crystal display that is manufactured using another heat treatment unit. In this case, a concave portion or a porous glass which functions as a low heat capacity band having a heat capacity lower than that of a glass substrate or the like may be formed in the glass substrate or the like.

Moreover, in addition to the concave portion or the porous structure, a low heat capacity band having a heat capacity lower than that of a material forming the substrate 2 may be used. Furthermore, if the low heat capacity band is formed to surround the temperature sensor 3 with a certain distance from the temperature sensor 3 and to have a certain depth from one surface of the substrate 2 toward the internal direction of the substrate 2, the low heat capacity band is not restricted in its structure. For example, a concave portion may be formed at a back side of the substrate 2. Also, a low heat-capacity material having a heat capacity lower than that of a material forming the substrate 2 may be buried in the concave portion 7 illustrated in FIGS. 2 and 3. Alternatively, by covering a surface of the concave portion 7 illustrated in FIGS. 2 and 3 with an insulation wall, heat is blocked from the concave portion 7, and thus, the entire transient thermal characteristics of the temperature measurement wafer 1 can be further enhanced.

Embodiments have been described above, but the present disclosure is not limited to the above-described embodiments. Various embodiments may be realized within the technical spirit and scope of the present disclosure. For example, even when a sensor is configured with a heat-resistant component and measures a temperature at a high heat range from 500 degrees C. to 1000 degrees C., it is applicable to enhance the transient thermal characteristics.

Detailed Example

A result, which has been obtained by performing a heat conduction simulation on the temperature measurement wafer 1 of the present disclosure with the heat fluid analysis software, "Fluent", will be described below.

Model 1 is a wafer in an actual semiconductor process, Model 2 is a conventional temperature measurement wafer, and Model 3 is the temperature measurement wafer 1 according to the present disclosure. Heat conduction simulations were performed on Models 1 to 3, respectively. In the temperature measurement wafer 1 (Model 3) according to the present disclosure, a simulation was performed on the temperature measurement wafer 1 where the concave portion 7 is formed around the temperature sensor 3 and which has been described in the above embodiments.

Figure 7:
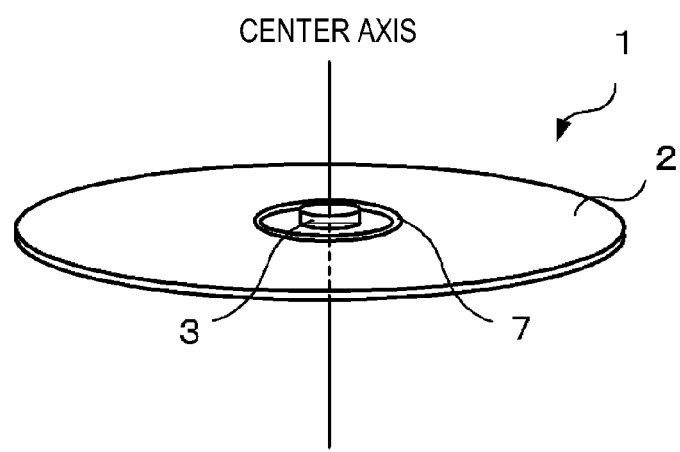
FIG. 7 is a perspective view illustrating a configuration example of a temperature measurement wafer according to Model 3 of a detailed example of the present disclosure.

A configuration of the temperature measurement wafer 1 for Model 3 of the detailed example will now be described with reference to FIG. 7. For Model 3 of the present simulation, a wafer is assumed where the temperature sensor 3 is disposed at the center of the substrate 2 of the circular temperature measurement wafer 1 and the concave portion 7 surrounds the periphery of the temperature sensor 3, and a simulation was performed on the wafer. For Model 2, a (conventional) temperature measurement wafer is assumed where the concave portion 7 surrounding the periphery of the temperature sensor 3 in FIG. 7 is not formed, and a simulation was performed on the wafer. For Model 1, a wafer is assumed as having the shape of only the substrate 2 of a circular wafer, and a simulation was performed on the wafer.

A configuration of a wafer for each of Models 1 to 3 will now be described in detail with reference to FIGS. 8 to 10.

Figure 8:
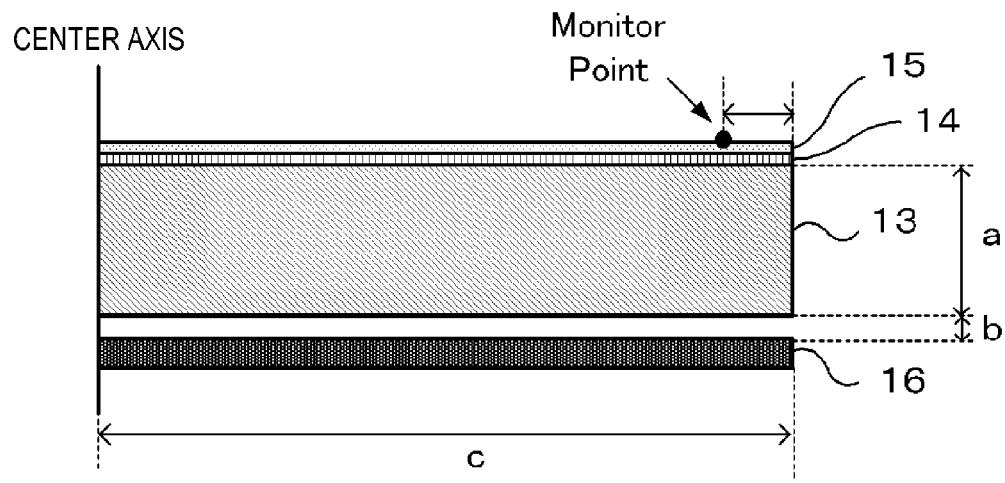
FIG. 8 is a sectional view illustrating a configuration of a wafer according to Model 1 of the detailed example.

As illustrated in FIG. 8, a wafer in an actual semiconductor process of Model 1 is configured with a Si substrate 13, a $SiO_2$ layer 14 thereon, and a polyimide layer 15 thereon. The wafer is heated [fixed at 130 degrees C.] by a stage 16. A thickness a of the Si substrate 13 is 0.775 mm, a distance b between the Si substrate 13 and the stage 16 is 0.1 mm, and a distance c (i.e., a radius of the wafer) from a center axis to an end portion of the wafer is 75 mm. A monitor point of the wafer for simulating a temperature is a position that is spaced apart by 0.1 mm from a right end portion of the wafer illustrated in FIG. 8.

Figure 9:
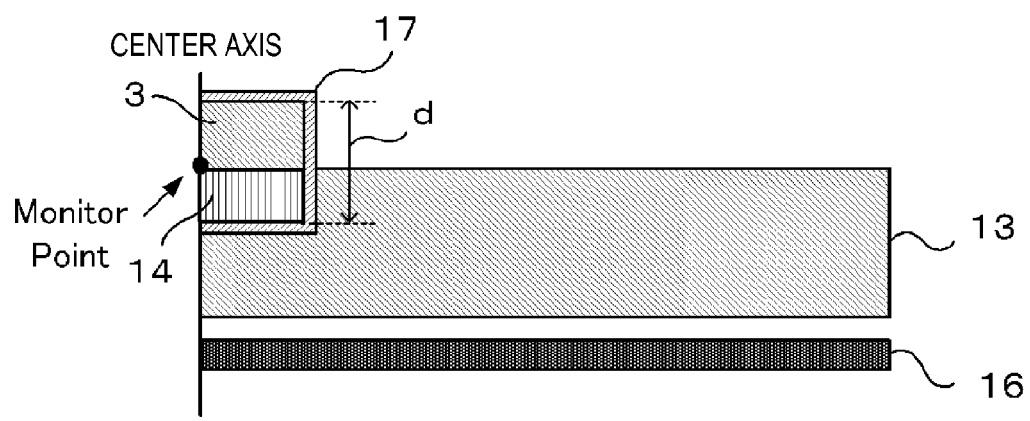
FIG. 9 is a sectional view illustrating a configuration of a temperature measurement wafer according to Model 2 of the detailed example.

Next, as illustrated in FIG. 9, a conventional temperature measurement wafer for Model 2 is configured with a Si substrate 13, a temperature sensor 3 formed of $Al_2O_3$, which is a substrate material, a $SiO_2$ layer 14 that functions as a protective layer, and a heat-resistant paste 17 that seals and adheres the temperature sensor 3 and is formed of silicon. The wafer is heated [fixed at 130 degrees C.] by a stage 16. A thickness a of the Si substrate 13, a distance b between the Si substrate 13 and the stage 16, and a distance c from a center axis to an end portion of the wafer are the same as those of Model 1. A height d of the temperature sensor 3 is 0.5 mm. A monitor point for simulating a temperature, as illustrated in FIG. 9, is an interface between the temperature sensor 3 and the $SiO_2$ layer 14, on the center axis of the wafer.

Figure 10:
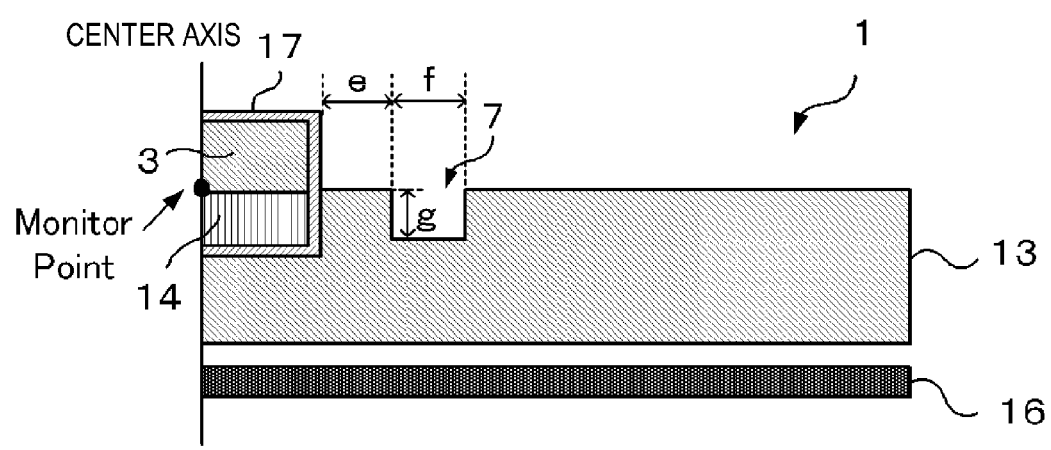
FIG. 10 is a sectional view illustrating a configuration of the temperature measurement wafer according to Model 3 of the detailed example.

As illustrated in FIG. 10, similarly to Model 2, the temperature measurement wafer 1 of the present disclosure for Model 3 is configured with a Si substrate 13, the temperature sensor 3, a $SiO_2$ layer 14, and a heat-resistant paste 17. However, as illustrated in FIG. 7, the concave portion 7 is formed on the Si substrate 13 to surround the periphery of the temperature sensor 3. The temperature measurement wafer 1 is heated [fixed at 130 degrees C.] by a stage 16. A thickness a of the Si substrate 13, a distance b between the Si substrate 13 and the stage 16, a distance c from a center axis to an end portion of the temperature measurement wafer 1, and a height d of the temperature sensor 3 are the same as those of Models 1 and 2. A distance e of the concave portion 7 from the heat-resistant paste 17 is 1.25 mm, a width f of the concave portion 7 is 1.25 mm, and a depth g of the concave portion 7 is 0.45 mm. A monitor point for simulating a temperature is the same as that of Model 2.

The heat conductivities were simulated with the Si substrate 13 being 148 W/m·K, the $SiO_2$ layer 14 being 0.90 W/m·K, the polyimide layer 15 being 0.29 W/m·K, $Al_2O_3$; that is, the substrate material of the temperature sensor 3 being 30 W/m·K, $SiO_2$ of the protective layer of the temperature sensor 3 being 1.10 W/m·K, and the silicon of the heat-resistant paste 17 being 0.70 W/m·K. A proximity gap is filled with air; that is, a space between the Si substrate 13 and the stage 16 is filled with air. Also, a space inside the concave portion 7 is filled with air, and the heat physical properties of the concave portion 7 are similar to those of air.

Figure 11:
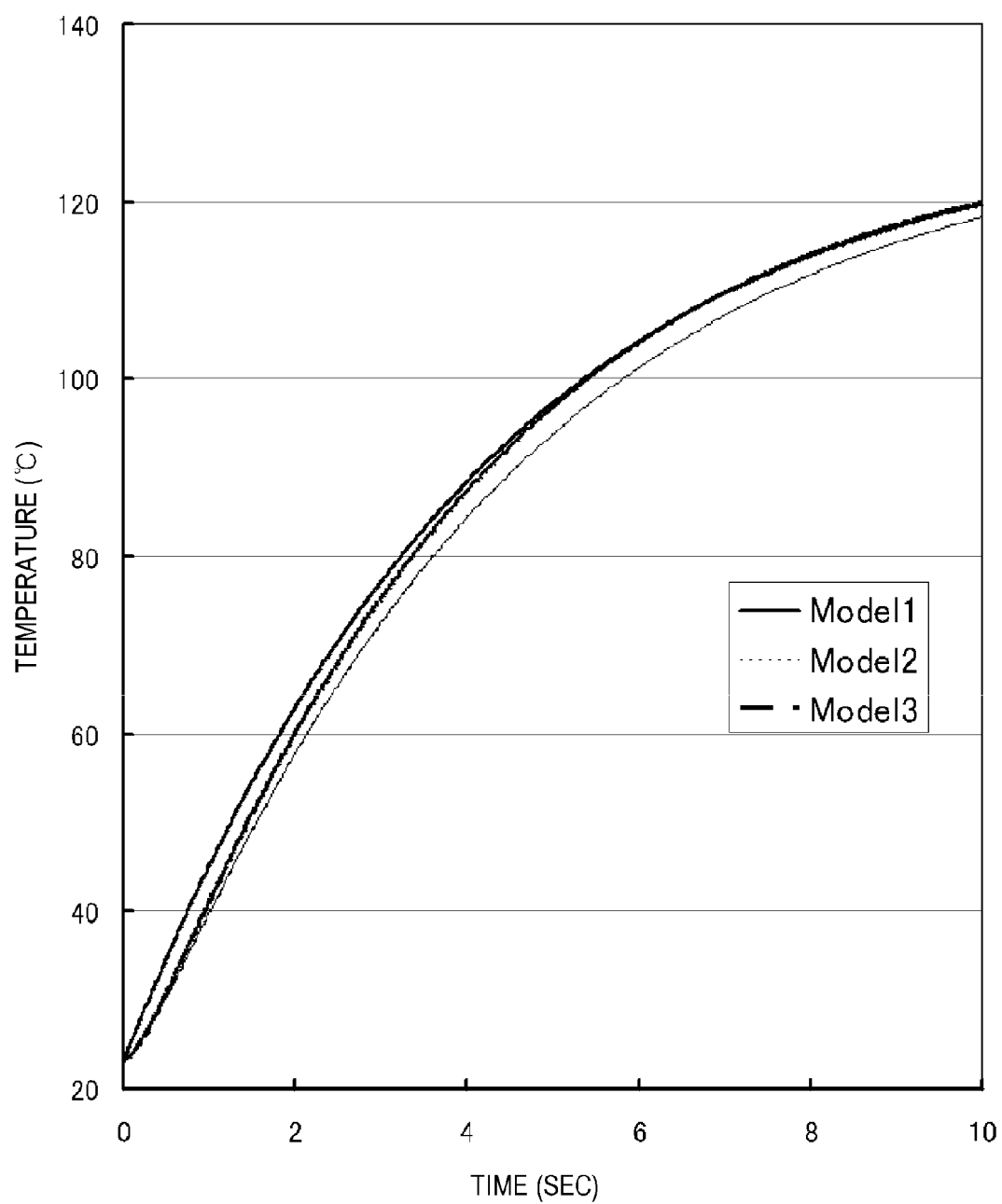
FIG. 11 is a view showing simulation results of Model 1 to Model 3 according to the detailed example for a heating time of 0 sec to 10 sec.
Figure 12:
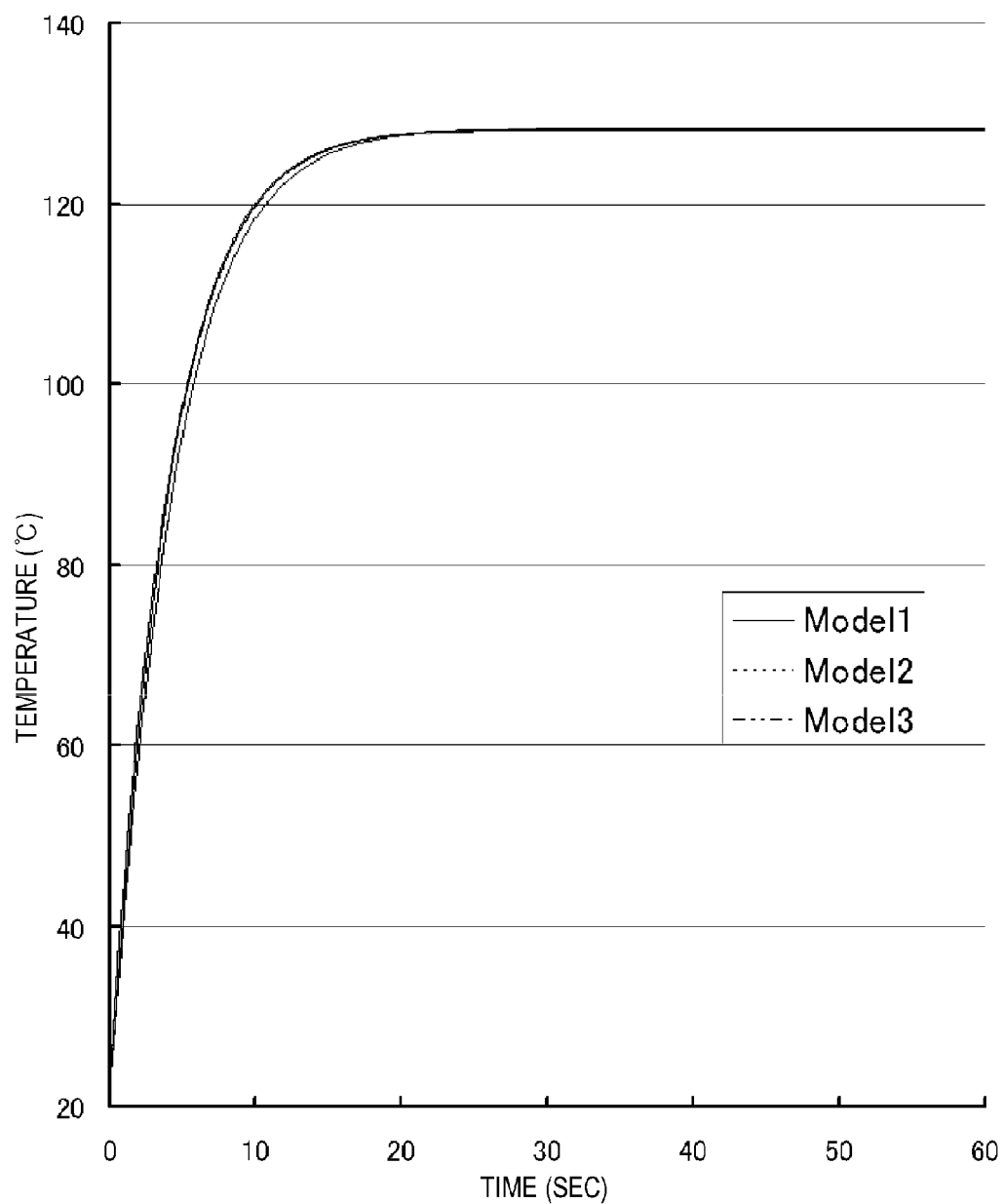
FIG. 12 is a view showing simulation results of Model 1 to Model 3 according to the detailed example for a heating time of 0 sec to 60 sec.
Figure 13:
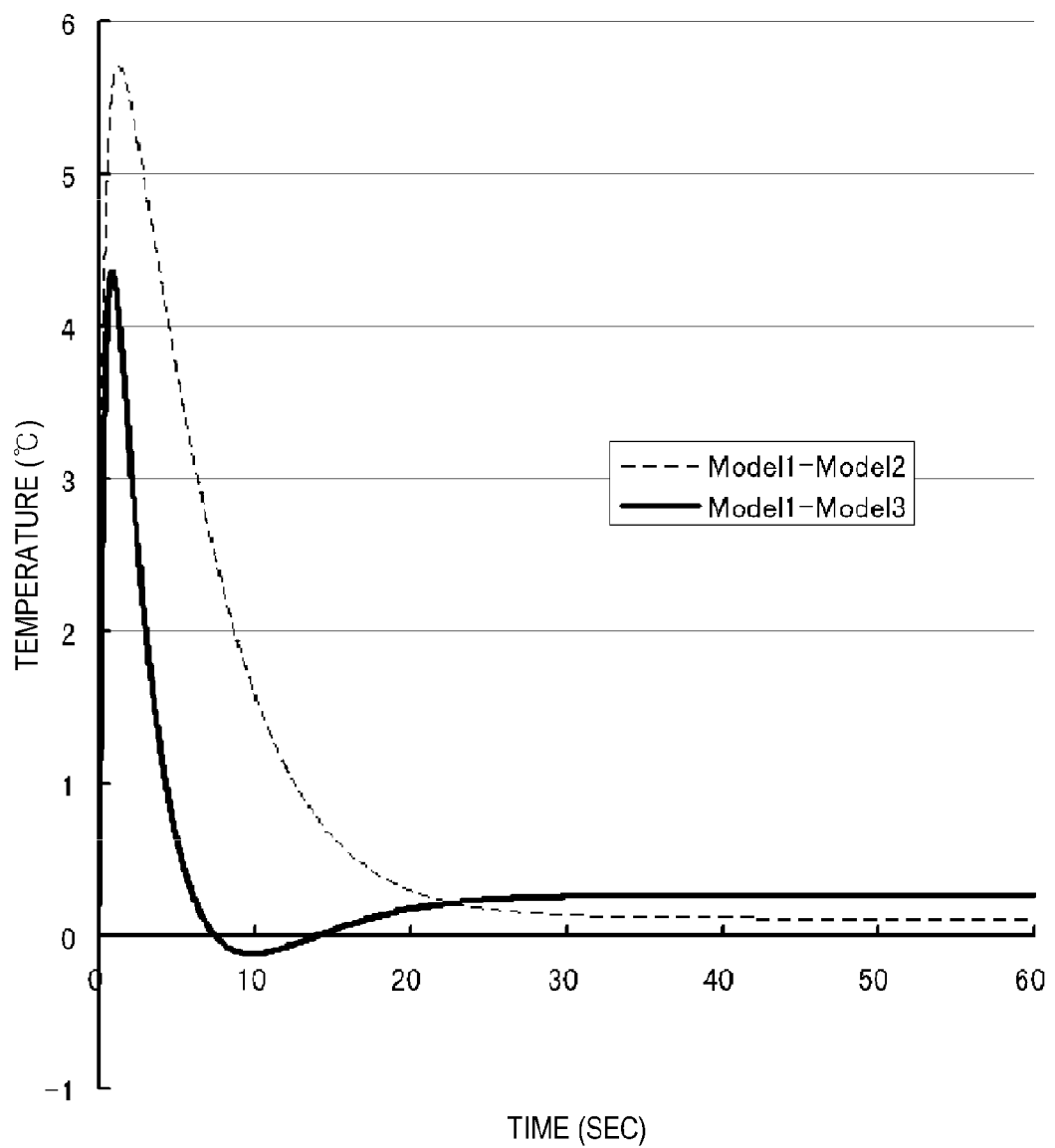
FIG. 13 is a view showing simulation results of a temperature difference (degrees C.) between Model 1 and Model 2 or Model 3 according to the detailed example.

In FIG. 11, simulation results of the temperature change that was detected by a temperature sensor for a heating elapse time of 0 sec to 10 sec are shown for Model 1 to Model 3, and Model 1, Model 3, and Model 2 are shown in descending order from high-temperature, at an elapse time of 2 sec. In FIG. 12, simulation results are shown for a heating elapse time of 0 sec to 60 sec for Model 1 to Model 3. In the simulation results, Model 1 and Model 3 almost overlap and Model 2 is slightly lower than Models 1 and 3 in descending order from high-temperature, at an elapse time of 5 sec. In FIG. 13, simulation results of a temperature difference between Model 2 or Model 3 and Model 1 is shown as a detailed example. As described above, FIG. 11 shows monitor temperatures in a time elapse of 0 sec to 10 sec for Model 1 to Model 3, FIG. 12 shows monitor temperatures in a time elapse of 0 sec to 60 sec for Model 1 to Model 3, and FIG. 13 shows a temperature difference between the monitor temperature of Model 1 and the monitor temperature of Model 2 or Model 3 (Model 1-Model 2 and Model 1-Model 3).

As shown in FIGS. 11 to 13, the transient thermal characteristics of Model 3 are degraded compared to Model 1. In Model 3, a temperature difference with respect to Model 1 first reduces faster (near 10 sec) compared to Model 2, and then the monitor temperature normalizes. This is considered that since the concave portion 7, which becomes a low heat capacity band having a heat capacity lower than that of the Si substrate 13, is formed around the temperature sensor 3, the transient thermal characteristics of Model 3 becomes close to the transient thermal characteristics of Model 1 when the peripheral of the temperature sensor 3 of Model 3 is seen macroscopically.

As shown in the results of the above-described simulation, even by forming a low heat capacity band, which is formed of a material having a heat capacity lower than that of a material forming the substrate, around the temperature sensor 3 instead of the concave portion 7 shown in Model 3, transient thermal characteristics around the temperature sensor 3 can become close to the transient thermal characteristics of an actual wafer. Therefore, the actual temperature of a wafer that is processed in the heat treatment unit can be measured at high precision. Also, a temperature immediately after the start of heating (change of a temperature) can be measured more accurately than for a conventional temperature measurement wafer.

Moreover, the elements of the present disclosure may be arbitrarily combined within the technical scope disclosed in the specification, to achieve the objects of the present disclosure.

The present disclosure is based on Japanese Patent Application No. 2009-288410, filed on Dec. 18, 2009. The specification references the specification, claims, and the entire drawings of Japanese Patent Application No. 2009-288410.

EXPLANATION OF REFERENCE NUMERALS

1: temperature measurement wafer
2: substrate
3: temperature sensor
4: wiring
5: processing part
6: power source part
7: concave portion
8: wire
9: hole portion
10: binder
11: sealing material
12: porous band
13: Si substrate
14: $SiO_2$ layer
15: polyimide layer
16: stage
17: heat-resistant paste

What is claimed is:

1. A temperature measuring apparatus, comprising:
a substrate;
at least one temperature sensor disposed at one surface of the substrate;
a low heat capacity band comprising a material and a groove to surround the at least one temperature sensor at a certain distance apart from the at least one temperature sensor and have a certain width and a certain depth, on the substrate,
wherein the material constituting the low heat capacity band has a heat capacity lower than a material forming the substrate, and
wherein the groove has a concave-shaped sectional surface.

2. The temperature measuring apparatus of claim 1, wherein the certain distance apart from the at least one temperature sensor, the certain width, and the certain depth of the low heat capacity band are determined such that a sum of a heat capacity of the at least one temperature sensor and a heat capacity of a peripheral member of the at least one temperature sensor becomes equal to a heat capacity of an actual substrate.

3. The temperature measuring apparatus of claim 1, wherein the material constituting the low heat capacity band has a porous structure.

4. The temperature measuring apparatus of claim 1, wherein the material constituting the low heat capacity band is nano crystal silicon.

5. The temperature measuring apparatus of claim 1, wherein,
a hole portion, in which the at least one temperature sensor is buried, is formed at one surface of the substrate,
the temperature measuring apparatus is comprised of a binder configured to fix the at least one temperature sensor in the hole portion, and a sealing material configured to seal the hole portion with the at least one temperature sensor fixed therein, and the low heat capacity band is formed to surround the at least one temperature sensor and the hole portion at a certain distance from the hole portion.

6. The temperature measuring apparatus of claim 1, wherein the temperature measuring apparatus has a wafer shape.

7. The temperature measuring apparatus of claim 1, wherein the at least one temperature sensor is an RTD.

8. The temperature measuring apparatus of claim 1, comprising:
   on the substrate,
   a detection unit configured to detect a temperature using the at least one temperature sensor;
   a storage unit configured to store data of a temperature which is detected by the circuit; and
   a feeding unit configured to supply power to the circuit.

* * * * *